US008404506B2

(12) United States Patent
Lochmann et al.

(10) Patent No.: US 8,404,506 B2
(45) Date of Patent: Mar. 26, 2013

(54) SINGLE-PHOTON SOURCE AND METHOD FOR THE PRODUCTION AND OPERATION THEREOF

(75) Inventors: Anatol Lochmann, Berlin (DE); Robert Seguin, Berlin (DE); Dieter Bimberg, Berlin (DE); Sven Rodt, Berlin (DE); Vladimir Gaysler, Novosibirsk (RU)

(73) Assignee: Technische Universitaet Berlin, Berlin (DE)

( * ) Notice: Subject to any disclaimer, the term of this patent is extended or adjusted under 35 U.S.C. 154(b) by 880 days.

(21) Appl. No.: 12/095,680

(22) PCT Filed: Nov. 20, 2006

(86) PCT No.: PCT/DE2006/002065
§ 371 (c)(1),
(2), (4) Date: Jul. 24, 2008

(87) PCT Pub. No.: WO2007/062625
PCT Pub. Date: Jun. 7, 2007

(65) Prior Publication Data
US 2010/0074293 A1 Mar. 25, 2010

(30) Foreign Application Priority Data

Nov. 30, 2005 (DE) .......................... 10 2005 057 800

(51) Int. Cl.
*H01L 21/00* (2006.01)
(52) U.S. Cl. ........... 438/31; 257/E33.026; 257/E33.031; 372/43.01; 372/45.01; 380/256
(58) Field of Classification Search .................... 438/31; 257/E33.031, E33.026; 372/43.01, 45.01; 380/256
See application file for complete search history.

(56) References Cited

U.S. PATENT DOCUMENTS

| 6,366,597 | B1 | 4/2002 | Yuen et al. |
| 6,507,042 | B1 * | 1/2003 | Mukai et al. ..................... 257/14 |
| 6,728,281 | B1 | 4/2004 | Santori et al. |
| 6,782,021 | B2 | 8/2004 | Huang et al. |
| 6,940,885 | B1 | 9/2005 | Cheng et al. |
| 7,292,613 | B2 | 11/2007 | Vuckovic et al. |

(Continued)

FOREIGN PATENT DOCUMENTS

| GB | 2367690 A | 4/2002 |
| GB | 2378319 A | 2/2003 |

(Continued)

OTHER PUBLICATIONS

C. Becher et al. "A quantum dot single-photon source" (2002) Physica E 13 p. 412-417.*

(Continued)

*Primary Examiner* — Julio J Maldonado
*Assistant Examiner* — Amar Movva
(74) *Attorney, Agent, or Firm* — Laurence A. Greenberg; Werner H. Stemer; Ralph E. Locher

(57) ABSTRACT

In a method for the production of a single photon source with a given operational performance, the given operational performance for the individual photon source may be fixed by a directed setting of the fine structure gap of the excitonic energy level for at least one quantum dot. The at least one quantum dot is produced with a quantum dot size corresponding to the fine structure gap for setting.

10 Claims, 12 Drawing Sheets

U.S. PATENT DOCUMENTS

| | | |
|---|---|---|
| 2003/0127608 A1 | 7/2003 | Shields et al. |
| 2003/0152228 A1 | 8/2003 | Gerard et al. |
| 2005/0161660 A1 | 7/2005 | Ward et al. |

FOREIGN PATENT DOCUMENTS

| | | |
|---|---|---|
| WO | 2004015454 A2 | 2/2004 |

OTHER PUBLICATIONS

Xu et al., "Electrically pumped single-photon sources in lateral p-i-n" Applied Physsics Letters, vol. 85, No. 15 (Oct. 11, 2004).

Shields et al., "Self-assembled quantun dots as a source of single photons pairs" phys. Stat. Sol. (b) 238, No. 2, 353-359 (2003).

Seufert et al., "Single-electron charging of a self-assembled II-IV quantum dot", Applied Physics Letter, vol. 82, No. 22 (Jun. 2, 2003).

Fiore et al., "Scaling quantum-dot light-emitting diodes to submicrometer sizes." Applied Physics Letter vol. 81, No. 10 (Sep. 2, 2002), pp. 1756-1758.

Bennett et al., "Microcavity single-photon-emitting diode" Applied Physics Letter, vol. 86, (Apr. 25, 2005).

Vuckovic et al., "Enhanced single-photon emission from a quantum dot in a micropost microcavity" Applied Physics Letter, vol. 82, No. 21 (May 26, 2002).

Gerard et al., "Quantun boxes as active probes for photonic microstructures: The pillar microcavity case", Appl. Phys. Lett., vol. 69, No. 4 (Jul. 22, 1996).

Moreau et al. Single-mode solid state single photon source based on isolated quantum dots in pillar microcavities Applied Physics Lett., vol. 79, No. 18 (Oct. 29, 2001).

Watanabe et al, "Patterning of confined-state energies in site-controlled semiconductor quantum dots", Applied Physics Letters, vol. 86, 243105, pp. 243105-1 to 243105-3 (2005).

Bennet et al, "Microcavity single-photon-emitting diode", Applied Physics Letters, AIP, American Institute of Physics, Melville, NY, US, vol. 86, No. 181102 (2005).

Aichele et al., "Muliplexed quantum cryptography with single InP quantum dots", Proceedings of the spie—The International Society for Optical Engineering Spie-Int. Soc. Opt. Eng USA, vol. 5722, Nr. 1, (2005) XP-002434143.

Bimberg et al., "Quantum Dot Heterostructures", Institute of Solid State Physics, Technische Universitat Berlin, Germany published by John Wiley & Sons (1998).

Knill et al., "A scheme for efficient quantum computation with linear optics", published by Macmillan Magazines Ltd., Nature, vol. 409, p. 46 (2001).

Shields, Andrew, "Quantum Logic with Light, Glass and Mirrors" published by Science, vol. 297, No. 5588, (Sep. 13, 2002).

Tittel et al.,"Violation of Bell Inequalities by Photons More Than 10 km Apart", Physical Review Letters, The American Physical Society, vol. 81,No. 17 p. 3563 (Oct. 26, 1998).

Benson et al., "Regulated and Entangled Photons from a Single Quantum Dot" Physical Review Letters, The American Physical Society vol. 84, No. 11 p. 2513 (Mar. 13, 2000).

Björk et al."Modification of spontaneous emission rate in planar dielectric microcavity structures" Physical Review, A, vol. 44, No. 1 The American Physical Society (Jul. 1, 1991).

Bennet et al., "Quantum Cryptography: Public Key Distribution and coin Tossing" International Conference on Computers, Systems, and Signal Processing, Bangalore, Inda , (Dec. 10-12, 1984).

Clauser et al., "Proposed Experiment to Test Local Hidden-Variable Theories" Physical Review Letters, vol. 23, No. 15 p. 880 (Oct. 13, 1969).

Young et al, "Inversion of exciton level splitting in quantum dots", Physical Review B 72, 113305 , The American Physical Society (2005).

Kim et al., "A Single-photon turnstile device", Letters to nature, vol. 3297, Macmillan Magazines Ltd. (Feb. 11, 1999).

* cited by examiner

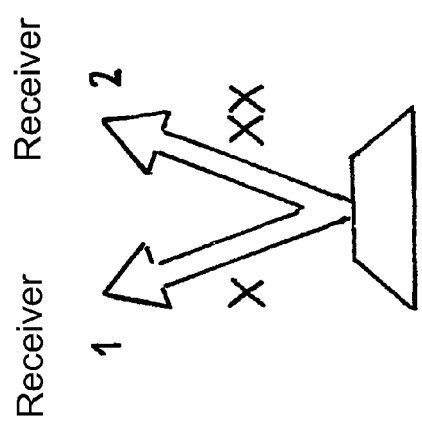
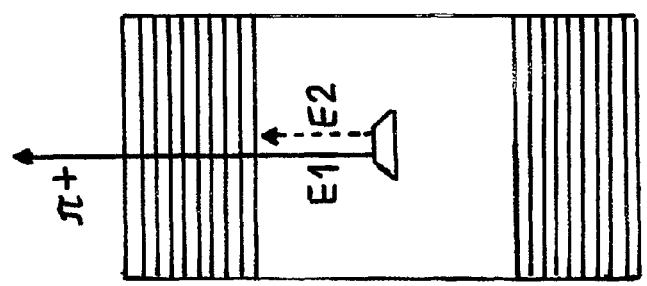
FIG. 3B
FIG. 3A

SINGLE-PHOTON SOURCE AND METHOD FOR THE PRODUCTION AND OPERATION THEREOF

BACKGROUND OF THE INVENTION

Field of the Invention

The invention relates to single-photon sources and methods for the production and operation thereof. In the text which follows, the term single-photon source is understood to mean photon sources which can emit single photons, particularly with a defined or predetermined polarization, entangled photons and cascades of correlated photons.

Among other things, single-photon sources are the core element of quantum cryptography. This is far superior to conventional encryption technologies. In the exchange of sensitive data such as, e.g. in the case of on-line business transactions, they offer absolute interception protection based on the laws of quantum mechanics. The data are initially encrypted with a conventional process. The key by means of which they can be decoded again is then transmitted separately and, for example, before the actual data in time. If this is done with a single-photon source, using quantum-cryptographic schemes, an unauthorized protection is noticed. The encrypted data packet will only be transmitted in conventional manner if it can be verified that the key has not been intercepted. Thus, greater volumes of data such as images or films which are graded to be worthy of protection can be transmitted in interception-proof manner at the usual speeds since the single-photon source is only used for transmitting the key.

An ideal single-photon source (photon gun) is a component which emits a single photon after a trigger signal, and only then (on demand). The central element of a single-photon source is optimally a quantized system with discrete energy levels. For this purpose, e.g. isolated atoms, molecules or quantum dots can be used.

In this context, quantum dots offer decisive advantages. In contrast to the isolated atom, the discrete energy levels of a quantum dot can also be excited in a non-resonant manner. An electrically operated structure can thus be realized embedded in a suitable semiconductor structure. This is of particular importance with regard to the marketing potential since the system integration is considerably simplified. In contrast, an optically excited structure would need additional components which complicate the production and later maintenance of the system and would increase the costs.

For implementing a single-photon source, a number of approaches are found in the literature. In the text which follows, three concepts from the multiplicity of published implementation possibilities which can be considered for an application in quantum cryptography "at least in principle" will be briefly explained.

One of the previous known concepts follows the concept of a light-emitting diode, the electroluminescence of which is based on the emission of a single quantum dot (compare the following printed documents: Xu, D. A. Wiliams, J. R. A. Cleaver, Appl. Phys. Lett., Vol. 85, No. 15 (11 Oct. 2004); A. J. Shields, R. M. Stevenson. R. M. Thompson, M. B. Ward, Z. Yuan, B. E. Kardynal, P. See, I. Farrer, C. Lobo, K. Cooper, D. A. Ritchie, phys. Stat. Sol. (b) 238, No. 2, 353-359 (2003); J. Seufert, M. Rambach, G. Bacher, A. Forchel, T. Passow, D. Hommel, Appl. Phys. Lett., Vol. 82, No. 22 (2 Jun. 2003); A. Fiore, J. X. Chen, M. Ilegems, Appl. Phys. Lett., Vol. 81, No. 10 (2 Sep. 2002) and A. J. Bennet, D. C. Unnitt, P. See, A. J. Shields, P. Atkinson, K. Copper, D. A. Ritchie, Appl. Phys. Lett., Vol. 86, No. 4 (25 Apr. 2005). In spite of the electrical excitation which is to be preferred for a commercial application, this approach is not very attractive due to its modest efficiency. This has essentially two causes: on the one hand, the lacking preferred direction for the photon emission, which is not very directional, leads to a low efficiency; on the other hand, the spontaneous emission rate of quantum dots is very low due to the comparatively long radiating life of the states (~1ns). In addition, the emission is not polarized.

Another previously known concept is based on a resonant coupling of the energetic states of a quantum dot to the modes of a microcavity (compare the following printed documents: J. Vuckovic, D. Fattal, C. Santori, G. S. Solomon, Y. Yamamoto, Appl. Phys. Lett., Vol. 82, No. 21 (26 May 2002); J. M. Gerad, D. Barrier, J. Y. Marzin, R. Kuszelewicz, L. Manin, E. Costard, V. Thierry-Mig, T. Rivera, Appl. Phys. Lett., Vol. 69, No. 4 (22 Jul. 1996); J. M. Gerad, D. Barrier, J. Y. Marzin, R. Kuszelewicz, L. Manin, E. Costard, V. Thierry-Mig, T. Rivera, Appl. Phys. Lett., Vol. 69, No. 4 (22 Jul. 1996) and E. Moreau, I. Robert, J. M. Gerad, I. Abram, L. Manin, V. Thierry-Mieg, Appl. Phys. Lett., Vol. 69, No. 4 (22 Jul. 1996). This previously known concept makes use of the Purcell effect which describes the influence of such coupling on the spontaneous emission rate. Overall, this second concept mentioned for a single-photon source, too is still very much in need of improvement because of high optical losses in the microcavity.

A third previously known concept is based on greatly weakened lasers. To render two-photon pulses improbable, the laser pulses are damped to an intensity of less 0.1 photon per clock cycle. This restricts the maximum data transmission rate since >90% of the clock cycles are "empty". In addition, the error rate is increased since photons can be generated and measured due to amplifier noise even if the clock cycle was actually "empty". This restriction in amplification limits the range of the transmission. Furthermore, two-photon pulses cannot be completely excluded. However, such pulses mean a gap in security since a listener can now measure a photon by means of a beam divider and send the second photon onto the receiver (photon number splitting—PNS) and interception protection is thus no longer given. The polarization of the emitted photons is also problematic: this is because if the state of polarization is completely uncontrolled, a polarization filter must be connected behind the single-photon source. This further reduces the number of photons and thus the data transmission rate.

BRIEF SUMMARY OF THE INVENTION

On the basis of the previously known prior art listed, the invention is based on the object of specifying a method for producing a single-photon source which can be carried out in a simple and reproducible manner.

According to the invention, this object is achieved by a method having the features according to claim 1. Advantageous embodiments of the method according to the invention are specified in the subclaims.

According to the invention, a method for producing a single-photon source is accordingly provided in which a predetermined operating characteristic is established by selectively setting the fine structure splitting of the exciton energy level of at least one quantum dot in that the at least one quantum dot is produced with a structural size (quantum dot size) corresponding to the fine structure splitting to be set.

The method according to the invention provides for the reproducible production of quantum dots with wanted electronic states and thus the reproducible production of single-photon sources having predetermined characteristics. This is because the inventors have found that the fine structure splitting of the exciton energy level of quantum dots is dependant on material strains. The invention is based on this finding in that it is proposed according to the invention to selectively establish the degree of strain within the quantum dots and the degree of strain within the surrounding material structure (e.g. semiconductor structure) by the choice of structural size of the quantum dot or dots, that is to say by the choice of the quantum dot size. This also defines the fine structure splitting and, if necessary, the energetic position of the exciton energy level from which the photons are emitted. Thus, a single-photon source having the desired characteristics can thus be produced by the choice of size or of the volume of the quantum dots alone—that is to say by the number of atoms which form the respective quantum dot. The method according to the invention makes it possible to produce compact single-photon sources which can emit defined linearly polarized single photons, entangled photon pairs or cascades of correlated photons.

It is considered to be advantageous if the material of the quantum dots and the material of the photon-conducting regions of the photon source are selected in such a manner that the wavelength of the photons corresponds to the dispersion or absorption minimum of Telekom glass fibers already installed (1.3 µm and 1.55, respectively). This can be achieved, for example, by means of quantum dots based on In(Ga)As in Ga(In,Al)As or In(Ga)P in Ga(In)P.

The method described is preferably carried out by using established methods of semiconductor technology.

To produce a single-photon source which can generate entangled photon pairs, at least one quantum dot is preferably formed with 800 to 5000 atoms of the quantum dot material. Such a small number of atoms or such a small quantum dot size, respectively, leads to such strain within the quantum dot and within the surrounding material structure so that the fine structure splitting of the exciton energy level becomes very small or—which would be ideal—is zero; in the case of a very small or nonexistent fine structure splitting, the photons emitted from the two "bright" states of the exciton energy level exhibit identical frequencies and are mutually entangled.

For example, during the production of a single-photon source generating entangled photon pairs, a fine structure splitting between −100 µeV and +100 µeV is set by choosing the quantum dot size. The normal energy level of the at least one quantum dot is preferably between 1.27 eV and 1.33 eV.

To produce a single-photon source which can generate individual photons with a defined polarization, the at least one quantum dot is preferably formed with 40 000 to 125 000 atoms of the quantum dot material. Such a large number of atoms or such a large structural size, respectively, leads to such great strain within the quantum dot and within the surrounding material structure that the fine structure splitting of the exciton energy level (bright exciton in the normal state) becomes very large; in the case of a very large fine structure splitting, the photons emitted from the two states of the exciton energy level have very different emission frequencies so that the "unwanted one" of the two photons can be filtered or suppressed without great effort by means of a filter.

For example, in the production of a single-photon source which can generate single photons with defined polarization, a fine structure splitting of at least +300 µeV is set in that the structural size of the at least one quantum dot is chosen to be correspondingly large, as mentioned. As mentioned, fine structure splitting which is as large as possible simplifies, for example, the filtering out of the unwanted additional photon.

The normal energy level of the at least one quantum dot is preferably less than 1.1 eV in the case of a single-photon source which generates individual photons with a defined polarization.

In addition, a method for producing a single-photon source in which a cavity having one or more longitudinal resonant frequencies is produced is considered as an independent invention, wherein a number of quantum dots which, during the operation of the single-photon source, generate photons having in each case their own emission frequency, are arranged within the cavity, in which a charge carrier injection device is produced and arranged in such a manner that, during the operation of the single-photon source, it can inject charge carriers into the area of the cavity and excite the quantum dots into generating the photons, and in which the density of the quantum dots is selected to be so low and the dispersion with respect to size and material composition of the quantum dots is selected to be so large that, during the operation of the single-photon source, only the emission frequency of a single quantum dot can correspond to one of the longitudinal resonant frequencies of the cavity and be coupled out of the cavity.

Using this method, single-photon sources can be produced in a very simple manner which can be electrically operated and which additionally follow the concept of resonant coupling of the exciton states of the quantum dots to the modes of the cavity due to the presence of a cavity. The cavity predetermines a preferred direction for the emission of the photons and, in addition, the spontaneous emission rate is increased by a multiple by utilizing the Purcell effect.

The cavity is preferably dimensioned in such a manner that the longitudinal natural frequency of the cavity used for coupling out the photons corresponds to the emission frequency of the quantum dot which, of all quantum dots excited, has the lowest emission frequency. This prevents a generated photon from being absorbed again in an unwanted manner.

To achieve that only a single quantum dot "actively" emits photons, the surface density of the quantum dots is preferably selected to be smaller than $5*10^9$ per square centimeter. A particularly preferred range is between $1*10^8$ and $5*10^9$ $cm^{-2}$.

The dispersion with respect to size and material composition of the quantum dots is preferably selected to be so large that the emission frequencies of the quantum dots are free of mutual overlap at the operating temperature of the photon source.

For the rest, it is considered to be advantageous if a current path limiting device is produced which focuses the current flow and thus the flow of the injected charge carriers in the area of the cavity in such a manner that only a subgroup of the quantum dots produced is excited inside the cavity. Such a current path limiting device, which could also be called a "selection device for quantum dots", makes it easy, even with a very large number of "excitable" quantum dots, to actually actively operate only a single one.

Furthermore, it is considered to be advantageous if a temperature adjusting device is produced by means of which the temperature of the single-photon source, for its operation, can be lowered to a temperature value at which the emission spectra of the quantum dots located within the cavity are free of overlap. This is because, in the case of a reduction in temperature, the spectral width of the emission spectra of the quantum dots is reduced so that emission spectra which are very closely adjacent to one another, which overlap at room temperature, can be separated. In addition, a lowering of temperature makes it possible to achieve a blue shift of the emission spectra so that—if none of the individual emission spectra of the quantum dots coincides "of its own accord"

with one of the longitudinal resonant frequencies of the cavity—at least one of the individual emission spectra can be shifted into a resonance region, and thus into a "feed-out region" by a selective temperature change of at least one of the individual emission spectra.

A method for producing a single-photon source in which a cavity having one or more longitudinal resonant frequencies is produced is also considered to be an independent invention, wherein at least one quantum dot layer is arranged inside the cavity, in which an exciting device is produced and arranged in such a manner that, during the operation of the single-photon source, it excites at least one quantum dot into generating photons, and in which a highly reflective layer is applied to the side walls of the cavity extending longitudinally to the direction of emission of the photons.

As stated above, the diameter of the cavity should be as small as possible in order to achieve maximum Purcell factors. To avoid a reduction of the diameter of the cavity resulting in the otherwise normally occurring optical losses—compare above statements relating to the prior art in conjunction with the second previously known concept—a highly reflective layer is proposed here which rests on the side walls of the cavity. In this manner, cavity qualities and Purcell factors can be achieved which are distinctly higher than those in the concepts presented initially. Particular significance is accorded to the side wall roughness of this metal layer since the associated scattering of light definitely limits the achievable Purcell factors.

The highly reflective layer can be implemented, for example, by a metal layer, e.g. gold layer.

Preferably, in addition, the field distribution is optimized even further via $AlO_x$ apertures within the cavity in order to reduce the optical losses in the side wall area of the cavity.

In addition, a single-photon source for emitting single, linearly polarized photons or entangled photon pairs, particularly for use in quantum cryptography, is considered as an independent invention, comprising one or more quantum dots which, during the operation of the single-photon source, generate photons having in each case an emission frequency, with a cavity within which the quantum dots are arranged, the cavity exhibiting one or more longitudinal resonant frequencies, and comprising a charge carrier injection device which, during the operation of the single-photon source, injects charge carriers into the area of the cavity and excites the quantum dots into generating the photons, wherein, during the operation of the single-photon source, only photons of a single quantum dot are coupled out, namely the photons of the quantum dot, the emission frequency of which corresponds to one of the longitudinal resonant frequencies of the cavity.

It is advantageous in the proposed single-photon source that only a single quantum dot can actually emit photons in spite of the presence of a number of basically "excitable" quantum dots because the emission frequency matches a resonant frequency of the cavity only in the case of one quantum dot. The multiplicity of available quantum dots advantageously guarantees a redundancy: this is because, if the excited quantum dot fails, another quantum dot, namely, for example, the energetically nearest one, can be selected by shifting the emission frequencies of the quantum dots (e.g. by changing the temperature), in that its emission frequency is brought to coincide with one of the longitudinal resonant frequencies of the cavity.

The cavity is preferably dimensioned in such a manner that the longitudinal natural frequency of the cavity used for coupling out the photons corresponds to the emission frequency of the quantum dot which, of all excited quantum dots, exhibits the lowest emission frequency.

The single-photon source preferably has a current path limiting device which focuses the flow of the injected charge carriers in the area of the cavity and reduces the number of quantum dots actually excited.

For the rest, it is considered to be advantageous if the single-photon source has a multiplicity of quantum dots which are arranged in a predetermined density and have a predetermined dispersion of their characteristics.

In a particularly preferred manner, the excited subgroup of the quantum dots is so small and the predetermined dispersion of the characteristics of the quantum dots is so large that the emission spectra of the quantum dots of the subgroup—at least individual ones of these but preferably all of them—are free of overlap at the operating temperature of the single-photon source.

For example, the density of the quantum dots is less than $5*10^9$ per square centimeter. A particularly preferred range is between $1*10^8$ and $5*10^9$ $cm^{-2}$.

According to a particularly preferred embodiment of the single-photon source, it is provided that there is a temperature adjusting device which lowers the temperature of the single-photon source, for operating it, to a predetermined operating temperature at which the emission spectra—at least single ones of these but preferably all of them—of the quantum dots located within the cavity are free of overlap.

In addition, a single-photon source for emitting single linearly polarized photons or entangled photon pairs—particularly for use in quantum cryptography—is considered to be an independent invention, comprising at least one quantum dot which, during the operation of the single-photon source, generates photons having one emission frequency, comprising a cavity within which the at least one quantum dot is arranged and which has a filter characteristic, in such a manner that only one resonant coupling occurs between a single one of the quantum dots and the cavity, and comprising an exciting device which, during the operation of the single-photon source, excites the at least one quantum dot into generating the photons, wherein a highly reflective layer, particularly a metal layer, is applied at the side walls of the cavity extending longitudinally to the direction of emission of the photons.

As already mentioned, the diameter of the cavity can be reduced, and the Purcell factor increased, by the highly reflective layer without a significant increase in the optical losses of the cavity.

A method for driving a single-photon source is also considered to be an independent invention, in which the temperature of the single-photon source is set in such a manner that the emission frequency of the quantum dot which, of all excited quantum dots, has the lowest emission frequency corresponds to a longitudinal natural frequency of the cavity of the single-photon source.

In addition, a method for driving a single-photon source is considered to be an independent invention in which the emission spectrum of an exciting device used for the optical excitation is set in such a manner that the emission spectrum is energetically above the states of the "active" quantum dot and is also in a range in which the cavity of the single-photon source is transparent.

In the text which follows, the invention will be explained in greater detail by means of exemplary embodiments, in which, by way of example:

BRIEF DESCRIPTION OF THE SEVERAL
VIEWS OF THE DRAWING

FIG. 1 diagrammatically shows the generation of photons by a quantum dot by means of a schematic energy diagram for an exciton X and a biexciton XX;

FIGS. 3A, 3B show the emission of definitely polarized photons with a high emission rate and the emission of photon pairs with entangled polarization;

Figure 10:
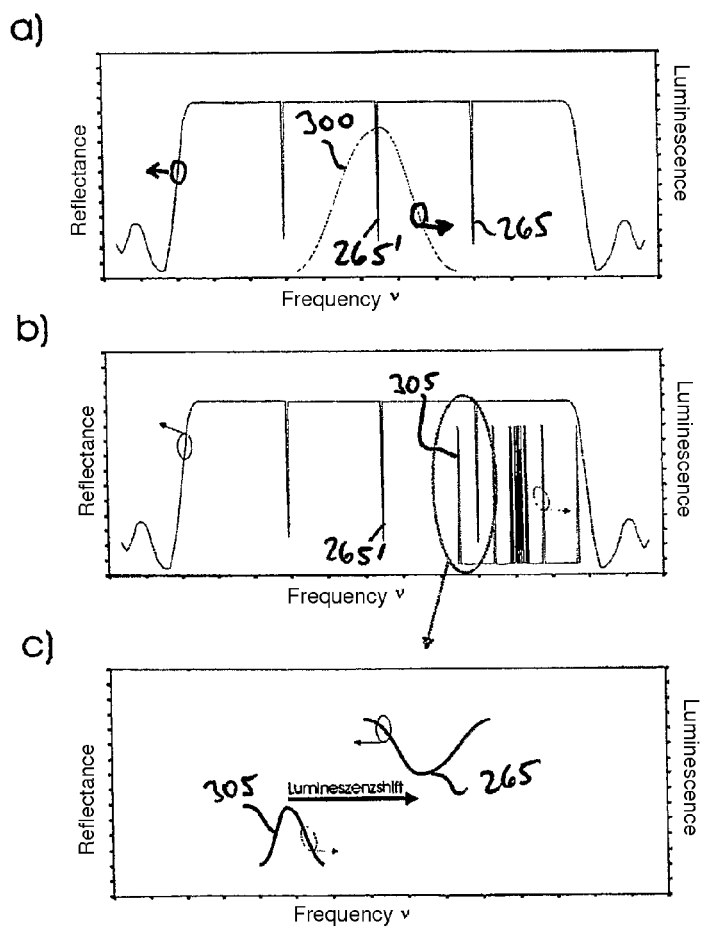
Figure 11:
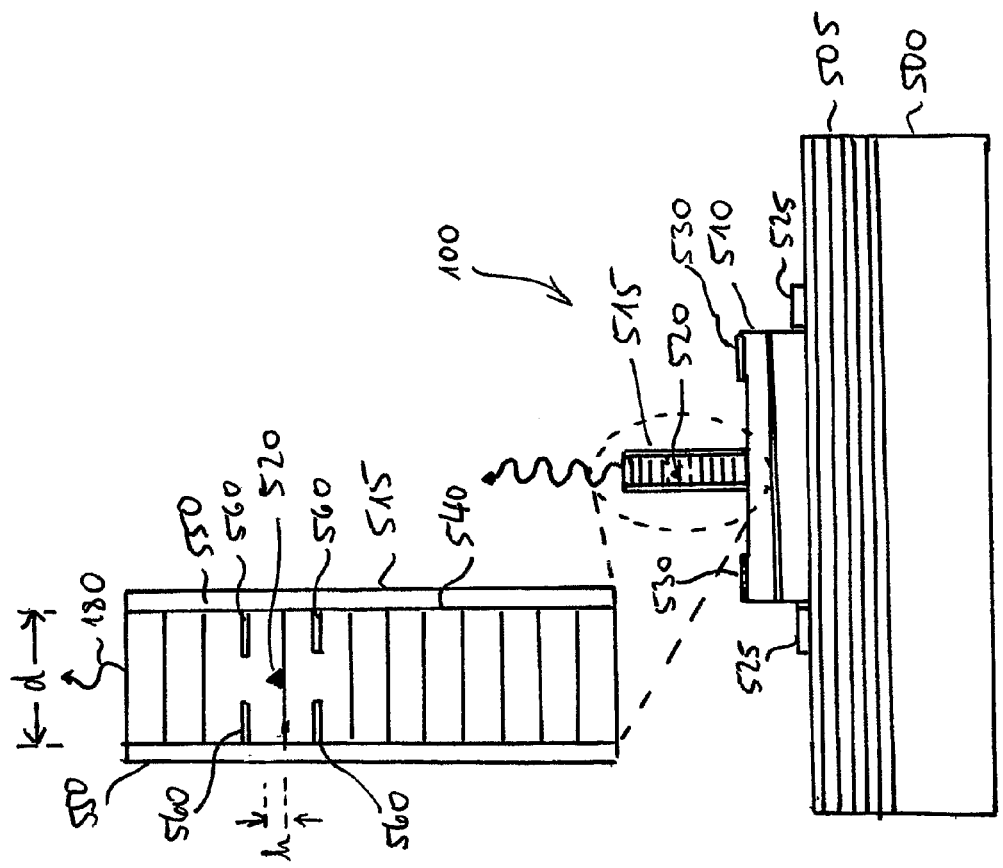
Figure 12:
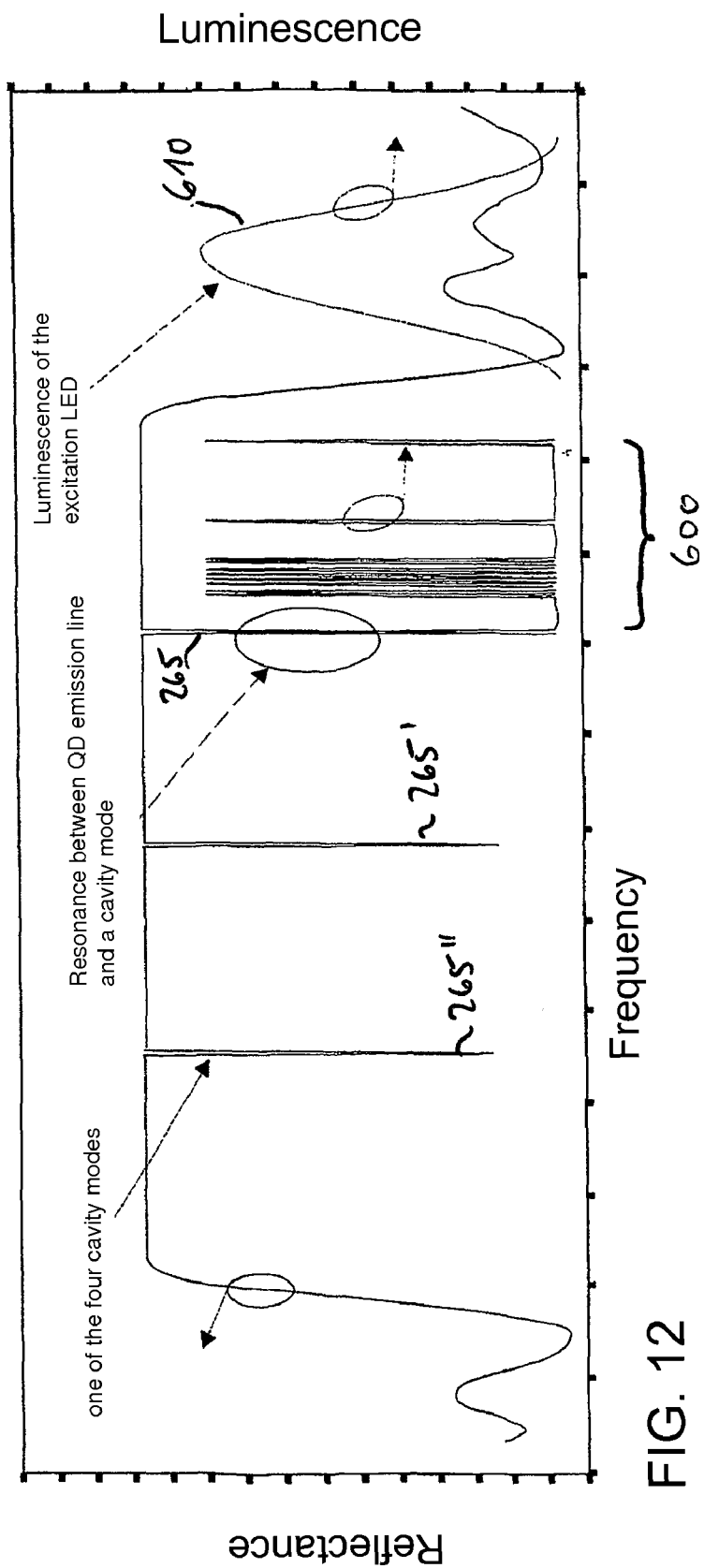

FIG. 10a)-c) show the coupling-out of the photons of the quantum dot having the lowest emission frequency by selective temperature control;

FIG. 11 shows a further exemplary embodiment of a single-photon source according to the invention; and FIG. 12 shows the luminescence spectrum of a quantum dot and the electroluminescence of an excitation LED of the single-photon source according to FIG. 11 at low temperatures.

DESCRIPTION OF THE INVENTION

For the sake of clarity, identical reference symbols are used for identical or comparable elements in FIGS. 1 to 12.

Figure 1:
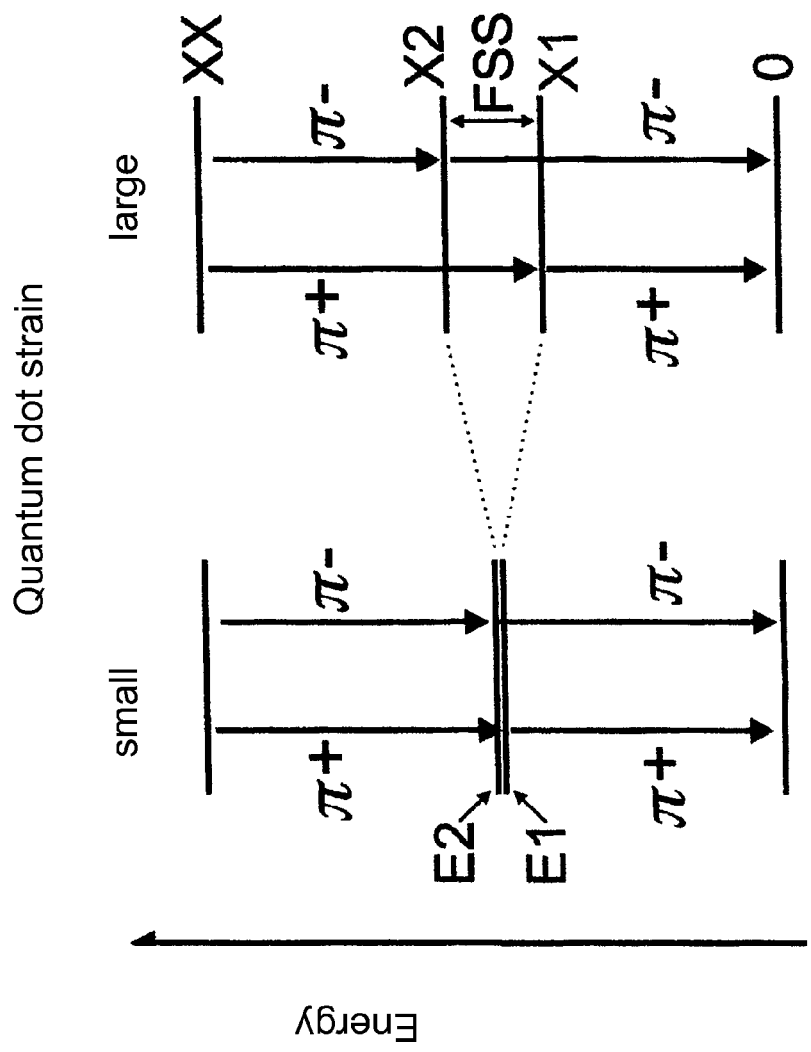

FIG. 1 shows a schematic energy diagram for an exciton X and a biexciton XX in a quantum dot. The fine structure splitting FSS of the exciton state is obtained at FSS=E2−E1. The two mutually perpendicular directions of polarization (π+, π−) of the emitted photons are drawn in.

Figure 2:
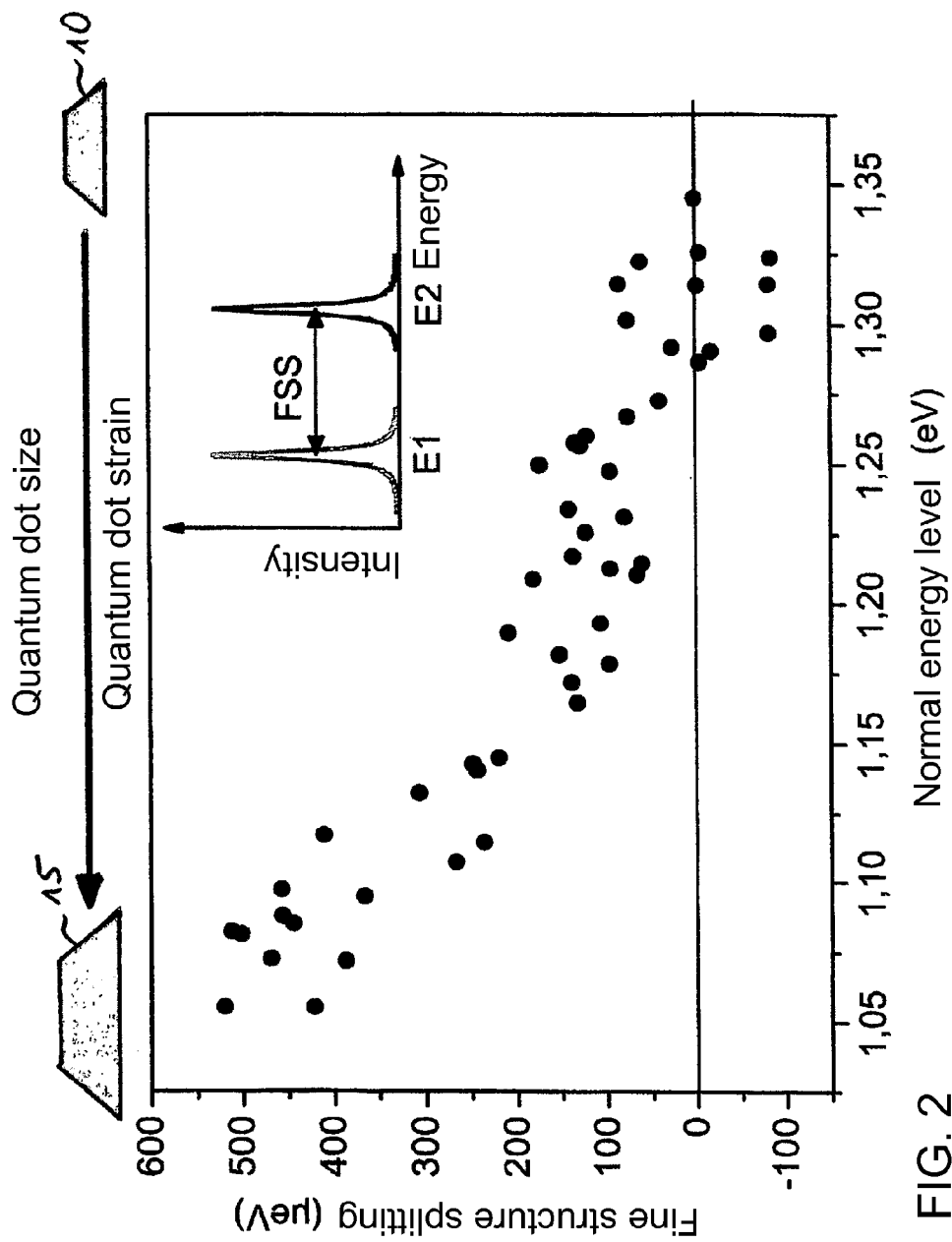
FIG. 2 shows the measured fine structure splitting of the bright exciton in the normal state as a function of the exciton energy and of the quantum dot size.

FIG. 2 represents the measured fine structure splitting of the bright exciton in the normal state on the example of InAs/GaAS as a function of the exciton energy and of the quantum dot size. The fine structure splitting is represented schematically as an energetic distance between the two exciton emission lines. It can be seen that the size of deposited epitaxial quantum dots is directly correlated with their strain and that the strain, in turn, determines the fine structure splitting; in FIG. 2, by way of example, a small InAs quantum dot consisting of 2400 atoms of the quantum dot material is identified by the reference symbol 10 and a large InAs quantum dot consisting of 40 000 atoms of the quantum dot material is identified by the reference symbol 15. Due to these relationships, it is possible to adjust the size of the fine structure splitting by producing quantum dots 10 and 15, respectively, of corresponding size. The quantum dots shown only diagrammatically in FIG. 2 preferably have the form of a truncated pyramid with a square base area.

Single-photon emitters based on quantum dots offer the essential advantage, compared with existing solutions such as, e.g. the weakened laser described initially—that, in principle, they can produce photons "on demand". This means that each pulse generates exactly one photon with 100% quantum efficiency. A single-photon source which is to be used for quantum cryptography must be able to emit either photons of a defined state of polarization or pairs of photons with entangled polarization on demand. To generate single photons with a defined polarization, the fine structure splitting must be as large as possible in order to be able to select a single exciton state with energetic filters, e.g. a matched cavity. To generate photon pairs with entangled polarization, the fine structure splitting must disappear at least approximately. In this context, photons from the biexciton→exciton→0 decade cascade are used (see also FIG. 1). In contrast, too large an energetic distance between the two existing exciton states prevents the state of entanglement of the emitted photon pair.

The deciding quantity for producing corresponding single-photon sources based on quantum dots is thus the fine structure splitting. It determines the energetic splitting of the normal exciton state into two states which are polarized perpendicularly to one another. The fine structure splitting has been observed in epitaxial quantum dots for the first time in the 90s. Without being able to control it, however, it was considered until today to be a disturbing parameter which prevents entangled photon pairs. Due to the method newly described here, selective size control of the fine structure splitting is now possible. The method proposed here allows the fine structure splitting to be controlled directly by adjusting the quantum dot size during the production of the quantum dots. The fine structure splitting depends on the spatial symmetry of the electron potential of a quantum dot. Strains in the quantum dot structures lead to piezoelectric fields which influence the potential symmetry and thus the fine structure splitting. In this context, it holds true that the greater the strain, the greater the fine structure splitting. Since the strain is dependant on the size of the quantum dots, the size of the fine structure splitting can be selected directly by choosing a particular quantum dot size.

In this context, FIGS. 3A and 3B show a diagrammatic representation of two examples. When a large fine structure splitting is chosen (FIG. 3A), a cavity amplifies the emission of an exciton via the Purcell factor and suppresses the other one. This results in photons polarized in defined manner with a high emission rate. Electrical pumping thus provides for the controlled generation of photons of a defined direction of polarization and high emission rate (e.g. for a BB84 application (quantum cryptographic transmission protocol)).

It is only when the fine structure splitting disappears (compare FIG. 3B: quantum dots with FSS=0) that photon pairs with entangled polarization can be generated. A corresponding emitter can send one each of the entangled photons of the biexciton→exciton→0 decay cascade to in each case one receiver 1 and 2, respectively (see FIG. 3B). In the case of entangled photon pairs, the measurement of the polarization of a photon directly determines the measurement result of the polarization of the other photon. Utilizing this quantum-mechanical effect, information can thus be transferred from one receiver to the other one in that one of the two receivers carries out measurements on "its" photon and thus determines the measurement result of the second receiver.

Figure 4:
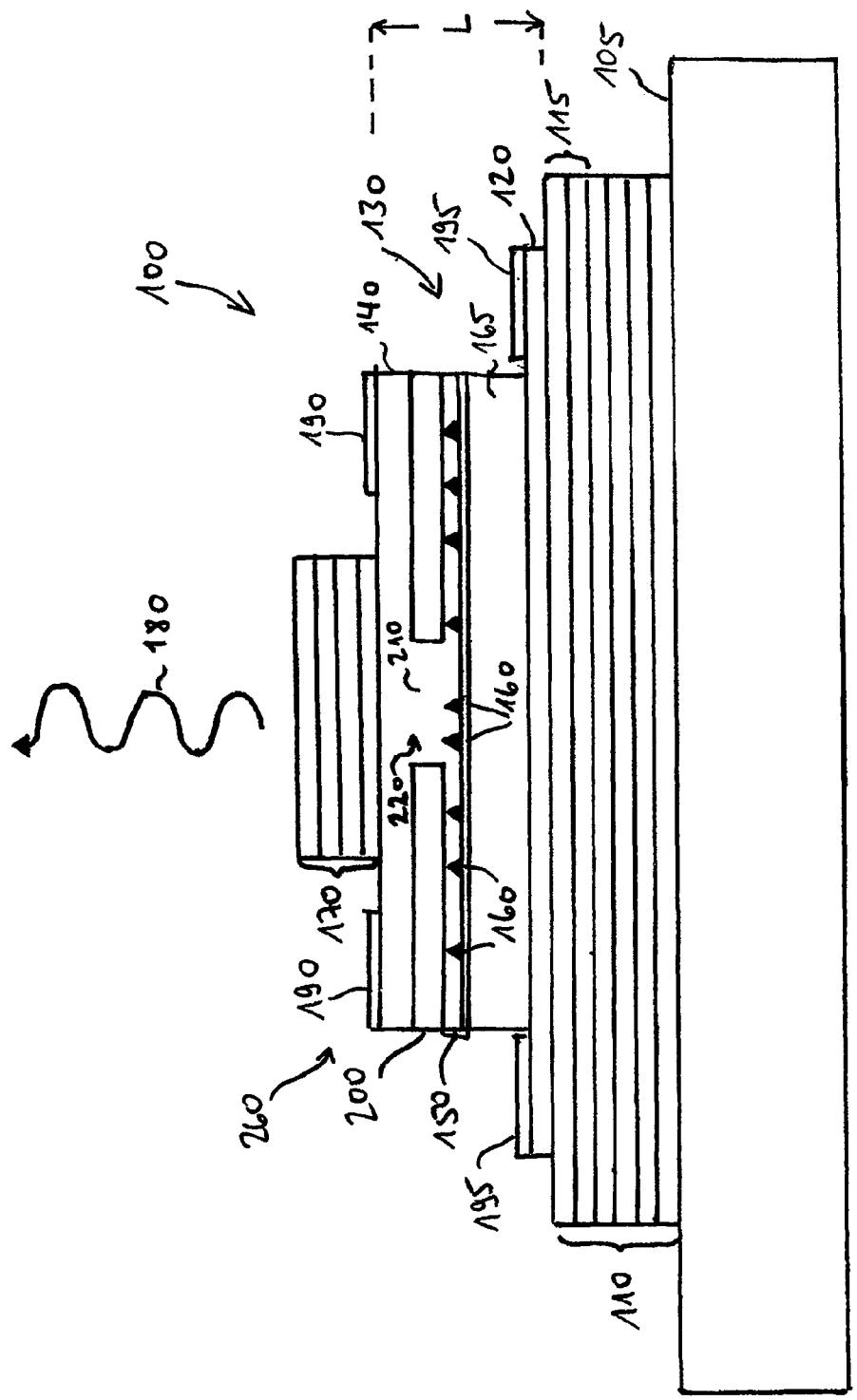
FIG. 4 shows a first exemplary embodiment of a single-photon source according to the invention.

FIG. 4 shows a first exemplary embodiment of a single-photon source 100 according to the invention in detail. A substrate 105 of, for example, GaAs material can be seen to which a lower Bragg mirror packet 110 (preferably of oxide material) with mirror layer pairs 115 of different refractive index is applied. On the lower Bragg mirror packet 110, a lower, for example n-type doped electrical contact layer 120 of a charge carrier injection device formed by a pin diode structure 130 is located. Between a, for example p-type doped upper electrical contact layer 140 of the pin diode structure 130 and the lower electrical contact layer 120, an active layer 150 with a multiplicity of quantum dots 160 (e.g. of In(Ga)As) is located in a monolayer, and an n-type doped intermediate layer 165. The quantum dots 160 have a predetermined density and thus a predetermined mean distance from one another. Above the upper electrical contact layer 140 of the pin diode structure 130, an upper Bragg mirror packet 170 is located through which photons 180 can emerge upward from the single-photon source 100. The upper mirror packet 170 preferably consists of oxide material.

Reference symbols 190 and 195 designate electrical connecting contacts of the single-photon source 100; the contacts 190 and 195 are particularly preferably intracavity contacts. Intracavity contacts are those which are arranged between the two mirror packets 110 and 170.

Above, below or within the active layer 150, there can also be a strain matching layer by means of which the material strain in the area of the quantum dots can be regulated with regard to the desired fine structure splitting and with regard to the setting of the emission wavelength.

In addition, FIG. 4 shows a non-conductive layer 200 with an opening 210; the non-conductive layer 200 forms a current aperture 220 through which the current I of the pin diode structure 130 flows.

Figure 5:
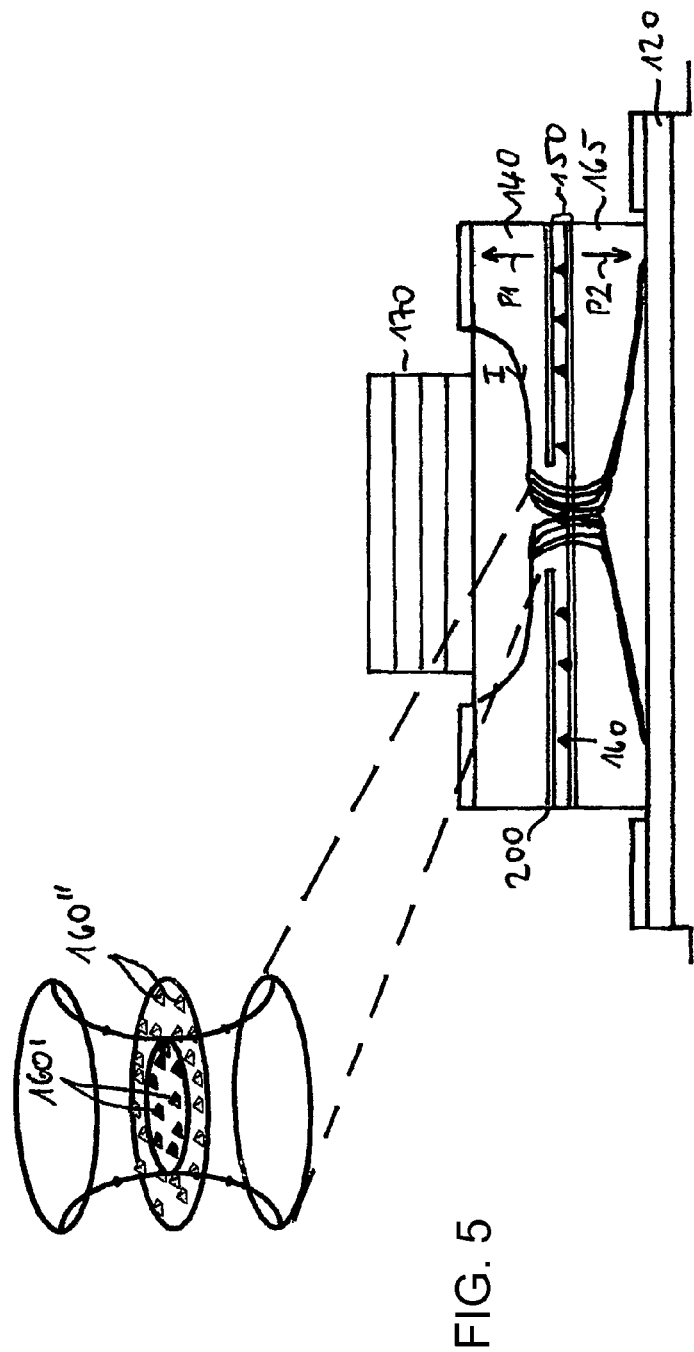
FIG. 5 shows the current flow within the single-photon source according to FIG. 4.

The current flow I is shown in greater detail in FIG. 5. FIG. 5 shows on the bottom right the upper part of the single-photon source 100 according to FIG. 4; at the top left, the current flow is visualized in a three-dimensional view in FIG. 5. It can be seen that the current aperture 220 forms a current path limiting device of the single-photon source 100 which limits the current in such a manner that only a subgroup 160' of the quantum dots 160 is excited; the remaining quantum dots 160" are not excited because no adequate current flows in their area.

In the exemplary embodiment according to FIG. 5, the current path of current I is also limited by a suitable doping profile in the n-type doped intermediate layer 165 and the p-type doped contact layer 140. The doping increases in each case towards the contacts in both layers and correspondingly falls off in the direction of the active layer 150 and in the direction of the quantum dots 160; this is indicated by the arrows P1 and P2 in FIG. 5. In general, the following holds true: the higher the doping level, the smaller the current path widening and the more inhomogeneously the current flows through the aperture. In this context, it is the aim of the current path limiting to electrically excite as few quantum dots 160' as possible from the quantum dot ensemble 160 and to leave as many quantum dots 160" as possible unexcited.

Figure 6:
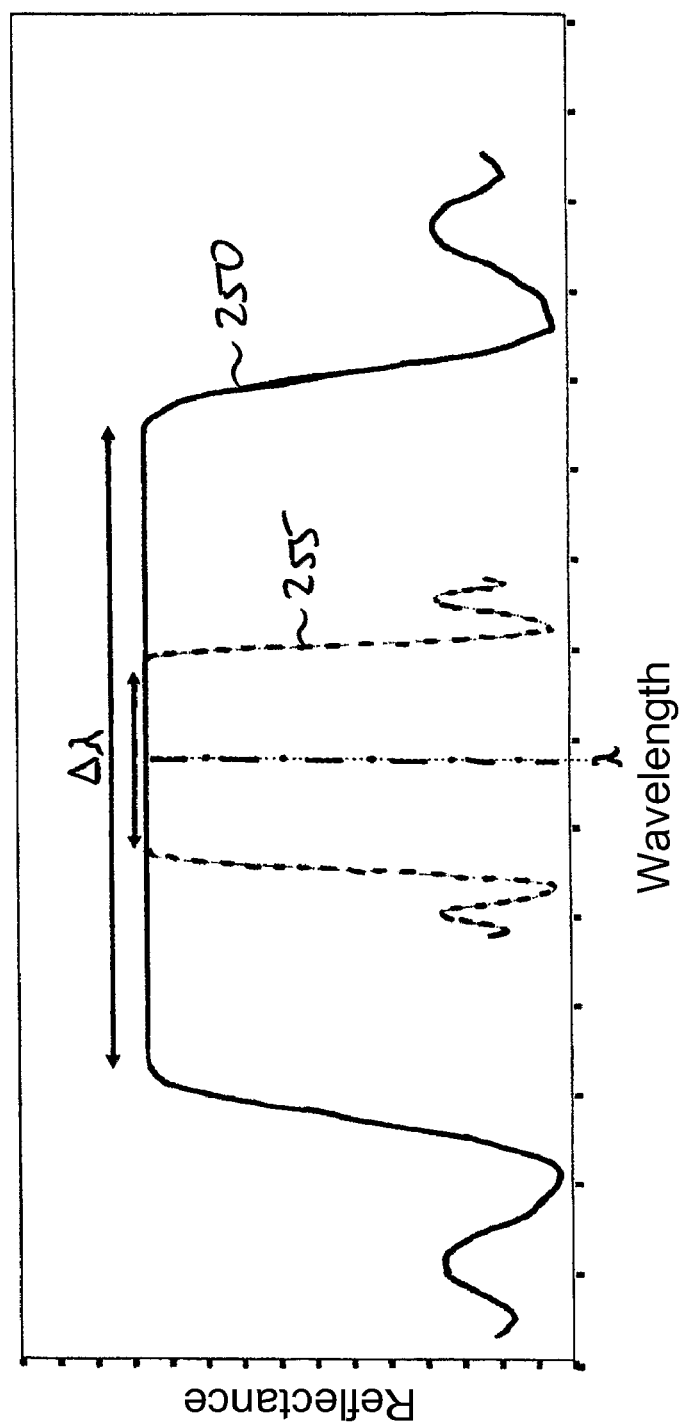
FIG. 6 shows the reflection spectrum of a lower Bragg mirror packet and of an upper Bragg mirror packet of the single-photon source according to FIG. 4.

FIG. 6 shows the reflection spectrum of the lower Bragg mirror packet 110 and of the upper Bragg mirror packet 170. Each mirror packet is basically designed for a wavelength $\lambda$. It consists of pairs of layers of a material having a high refractive index and of a material having a low refractive index, the optical thickness of which is in each case $\lambda/4$. The higher the refractive index contrast (compare curve 250 for a high refractive index contrast and curve 255 for a low refractive index contrast), the wider the stop band $\Delta\lambda$, the less the depth of penetration of the wavelength into the mirrors and the fewer mirror pairs are needed for high reflectivity.

Figure 7:
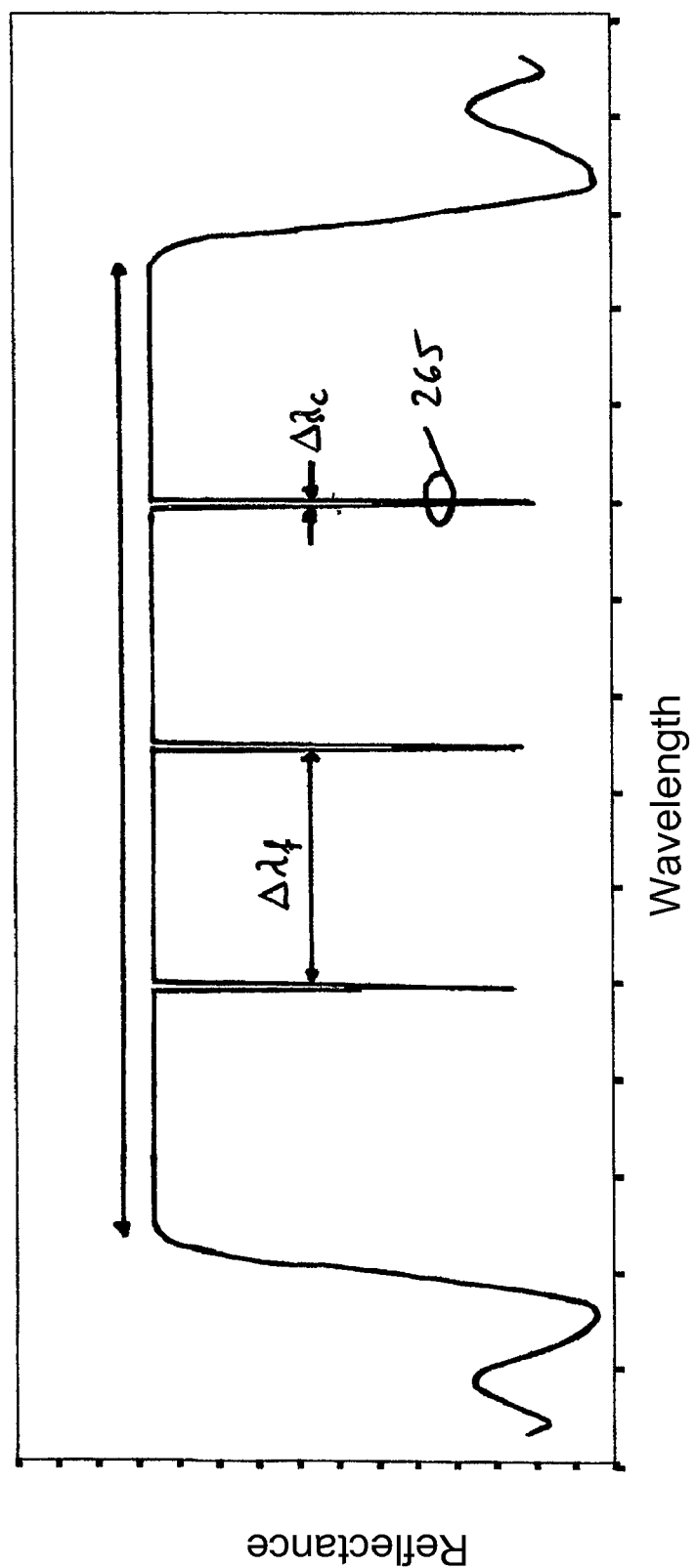
FIG. 7 shows the reflection spectrum of a cavity of the single-photon source according to FIG. 4 in detail.

The lower Bragg mirror packet 110 and the upper Bragg mirror packet 170 form a microcavity 260 (compare FIG. 4). The term microcavity is understood to mean cavities having a size in the micrometer range. FIG. 7 shows the reflection spectrum of the cavity 260 in detail. The higher the quality of the cavity, the smaller the spectral width $\Delta\lambda c$ of so-called cavity dips 265 of the cavity 260. Cavity dips are the longitudinal modes of the cavity. The spectral width $\Delta\lambda c$ of the cavity dips 265 defines the quality of the cavity. The higher the quality, the narrower the cavity dip. The free spectral range $\Delta\lambda f$ between the cavity dips is dependant on the length L of the cavity. The greater this length, the closer the cavity dips 265 are together. The modes of the cavity form a standing spatial field distribution. The cavity length L is preferably as short as possible, an ideal length would be $L=\lambda/2$, $\lambda$ designating the wavelength of the photons emitted.

As already mentioned initially, quantum dots have discrete energy states and thus a discrete luminescence spectrum. The states, and thus the luminescence characteristics of a quantum dot are critically dependant on three parameters: material composition, size and shape of the quantum dots and the temperature. Since after the completion of the component, the temperature is the only parameter which is still variable, it is accorded special significance. For this reason, it will be discussed in greater detail at this point. If the temperature is increased, a line widening and red shift of the luminescence occurs. This is shown in FIG. 8.

Figure 8:
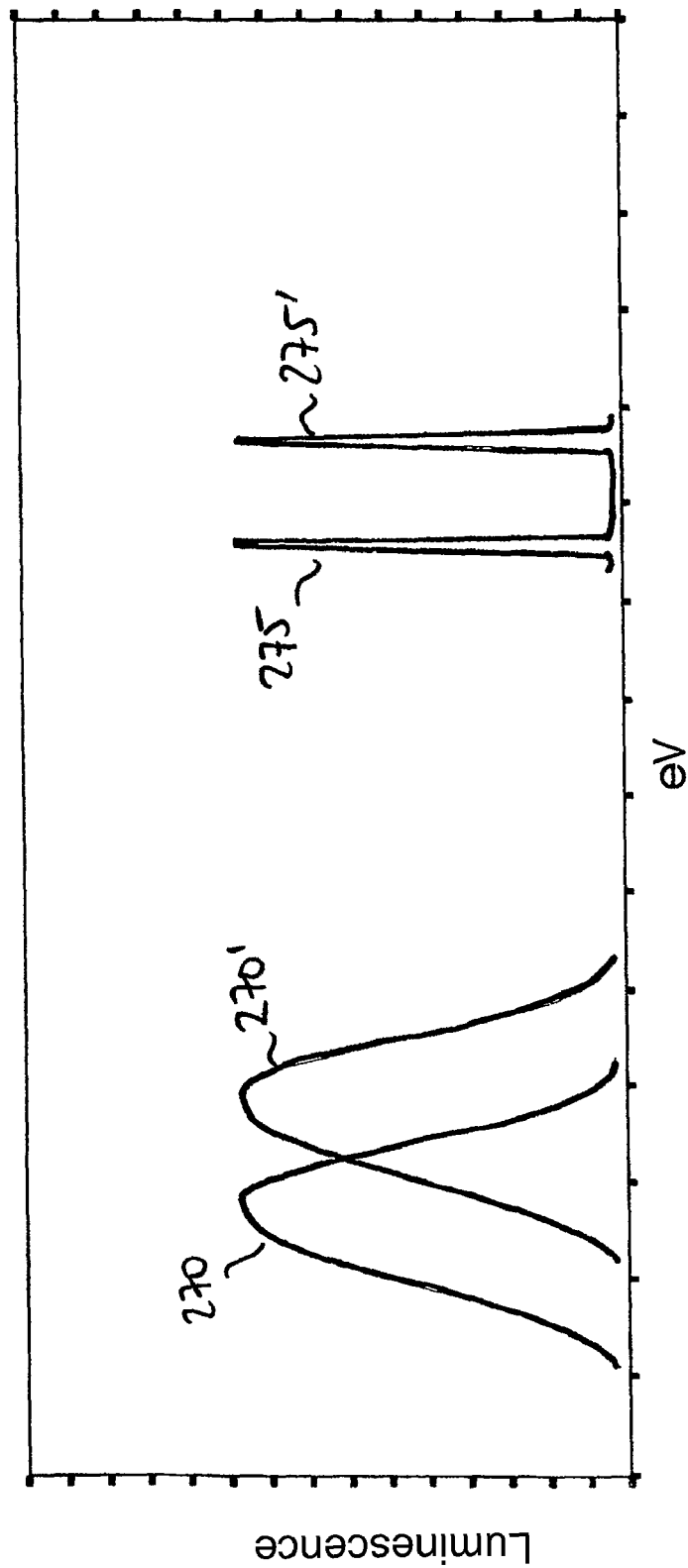
FIG. 8 shows luminescence characteristics of two quantum dots of the single-photon source according to FIG. 4 at different temperatures.

FIG. 8 shows the luminescence of two individual quantum dots: curves 270 and 270' show the luminescence at room temperature, curves 275 and 275' show the luminescence at low temperatures (~4 K). With increasing temperature, a line widening and a red shift occurs; in the case of a reduction in temperature, a line width reduction and a blue shift of the luminescence, the distance between the peaks remaining constant.

In the epitaxial growth of quantum dots, a fluctuation with respect to size and composition occurs around a mean value. This has a direct effect on the luminescence characteristics. A distribution around a mean photon energy occurs. The luminescence spectrum of an ensemble of quantum dots of similar size and material composition, which is discrete at low temperatures, fuses at room temperature to become a wide red-shifted emission spectrum. This is shown by way of example in FIG. 9.

Figure 9:
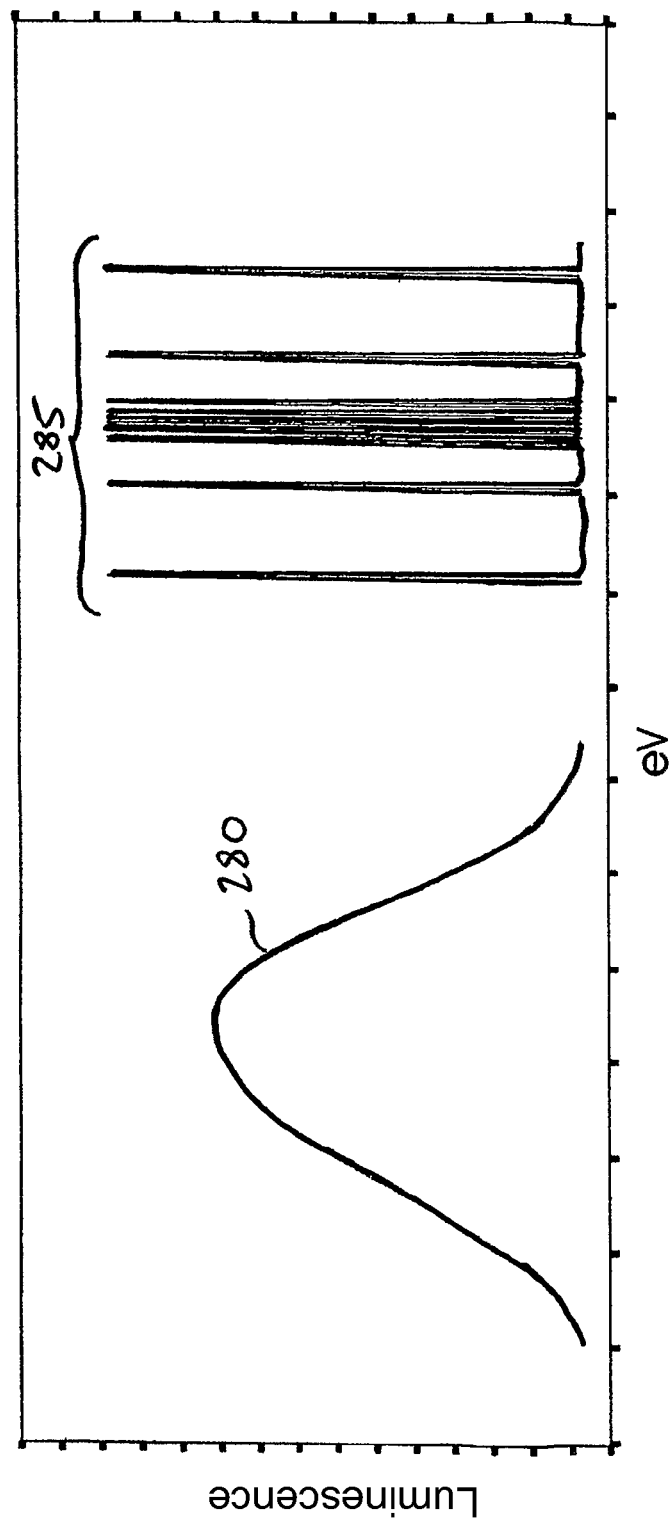
FIG. 9 shows luminescence characteristics of an ensemble of quantum dots in the single-photon source according to FIG. 4 at different temperatures.

FIG. 9 shows a luminescence spectrum of an ensemble of quantum dots which are similar in size and material composition, once at room temperature (curve 280) and at low temperatures (curve 285). The intensity distribution of the emission spectrum reflects the distribution function of the quantum dots. It can be easily seen that, the more the size and composition of the quantum dots moves away from their mean value, the more the number of excited quantum dots decreases. Thus, a resonant excitement of individual quantum dots can only be achieved if the emission peaks of the quantum dots do not overlap. This can be achieved by an adequate energetic distance between the quantum dots or by lowering the operating temperature as a result of which the emission lines are separated from one another.

The single-photon source 100 shown in FIG. 4 can be split mentally into two basic elements: the first basic element is formed by the pin diode structure 130 within which the monolayer of quantum dots 160 is located. The second basic element is formed by a single quantum dot resonantly coupled to the microcavity 260. In order to achieve that only a single one of the excited quantum dots 160' according to the figure can actually deliver photons to the outside, the selecting effect of the cavity dip 265 is utilized. For this purpose, the single-photon source 100 is operated in a temperature range in which the luminescence spectrum consists of individual non-overlapping emission lines.

The current path limiting device has already considerably restricted the number of excited quantum dots 160' with reference to the total number of quantum dots 160. As already indicated above, the remaining electrically excited quantum dots 160' are subject to a certain distribution with respect to their energetic states. By changing the temperature, it is now possible, with a sufficiently small cavity dip width Δλc to achieve that only a single quantum dot is resonantly coupled to the cavity 260.

In principle, the situation shown in FIG. 10a) corresponds to the conditions in a VCSEL (vertical cavity surface emitting laser) structure. The cavity dip 265' lies in the peak of the thermally widened luminescence distribution 300 of the quantum dots. Most of the states of the individual quantum dots overlap there, with the consequence that many quantum dots are simultaneously resonantly coupled to the cavity. This is very welcome in a laser structure since thus most of the quantum dots contribute to the induced emission. The situation changes fundamentally as the temperature is dropped.

In FIG. 10b), there is no quantum dot state in resonance with the microcavity. The cavity dip 265' is located at the edge of the luminescence distribution of the quantum dot ensemble. To put it more precisely—on the side with the longer waves (i.e. on the low-frequency or low-energy side in the representation).

The enlargement of a section in FIG. 10c) shows that one of the luminescence lines 305 can be brought into resonance with the cavity by further cooling. If this happens, only a single quantum dot is in resonance with the cavity. Reabsorption of the photons of this quantum dot which is in resonance with the cavity is not possible since the excitation energies for the other quantum dots of the surrounding pin diode structure 130 are higher.

The structure according to FIG. 4 is thus capable of resonantly coupling a single electrically excited quantum dot 160' to the microcavity 260.

To illustrate the operation of the single-photon source 100, the differences between previously known VCSEL laser structures and the single-photon source 100 shown in FIG. 4 will be briefly summarized again:

in spite of the great similarities between a VCSEL and the structure proposed here, there is a number of essential differences which have their origin in the completely opposite application of the two components. On the one hand, these are design differences and on the other hand, the characteristics of the individual components are utilized with different aims. In the single-photon source 100, the active layer only consists of a monolayer with quantum dots. The aim in growing this monolayer is to achieve the lowest possible density and a high fluctuation with respect to size and material composition of the quantum dots 160. This is ensured by suitably guiding the crystal growth. Both are aimed at maximizing the energetic distance between the individual luminescence lines of the quantum dots so that a selection of a single line, and thus the resonant coupling of a single quantum dot, can be achieved. In the case of the VCSEL laser, in contrast, it is precisely this which is to be avoided. For this reason, a number of quantum dot layers are placed with maximum density in the cavity. In this arrangement, the fluctuation of the quantum dots during the growth should be minimum so that as many quantum dots as possible can be brought into resonance with the cavity by widening the luminescence lines at room temperature and the subsequent overlapping. For this reason, the VCSEL structure is also designed in such a manner that the cavity dip is located in the peak of the luminescence distribution at operating temperature.

In contrast, reabsorption by non-excited quantum dots has a negative effect in both components. In the VCSEL, the approach for avoiding these consists in electrically exciting all quantum dots located in the cavity, if possible. For this purpose, the current flow through the aperture is made to be as homogeneous as possible so that quantum dots which are not located in the center of the aperture are also pumped. As already mentioned above, the latter is unwanted in the single-photon source 100 according to FIG. 4 since in this case the least possible number, ideally only a single quantum dot, should be electrically excited. To then prevent reabsorption losses at nonexcited quantum dots, the single-photon source 100 is preferably designed in such a manner that the cavity dip 265 is at the low-energy side of the luminescence distribution at operating temperature. If the cavity is in resonance with a quantum dot, the recombination energy of which is lower than that of all other quantum dots, the photons emitted by it can no longer be reabsorbed within the structure because their energy is too low for an absorption by the other quantum dots.

Differences between a VCSEL laser and the single-photon source 100 according to FIG. 4 also exists with respect to the choice of cavity length L. In the VCSEL, the optimum placement of the largest number of layers in the peaks of the spatial field distribution within the cavity is of primary interest. As a rule, the VCSEL cavity length is one- to five-times the emission wavelength of the laser. One of the primary aims in the design of the single-photon source 100 is, in contrast, the optimum utilization of the Purcell effect and the associated increase in the spontaneous emission rate. Since the mode volume plays a significant role in this context, the cavity length is selected to be as short as possible, ideally, the cavity length is $\lambda/2$ which is possible by choosing a small mean refractive index (smaller than the refractive index of the adjoining upper and lower mirror layer).

The single-photon source 100 described meets all requirements, listed initially, for a component which can be used for quantum cryptography. In the first instance, the possibility should be mentioned of processing electrical signals directly. This considerably simplifies system integration. The resonant coupling of the quantum dots states to the modes of a microcavity ensures an adequate spontaneous emission rate by utilizing the Purcell effect. Together with the preferred direction of emission also given by the cavity, the efficiency is thus matched to the requirements of a realistic component. The optical losses occurring during the injection into optical fibers are also minimum. The cause of this is the radiation characteristic, which is identical with the VCSEL, which is distinguished by small aperture angles and round beam profiles. In principle, the use of quantum dots enables the component to use the wavelengths of 1.3 μm and 1.55 μm which are of interest to telecommunication. Due to the structural similarity with the VCSEL, the single-photon source 100 presented additionally provides the advantage that its production can be achieved with methods and processes which are already established.

If the single-photon source 100 according to FIG. 4 is intended to generate entangled photon pairs, the quantum dots 160 are formed preferably with 800 to 5000 atoms of the quantum dot material in the case of In(Ga)As. With such a size of the quantum dots, the fine structure splitting, as a rule, is small enough for being able to generate entangled photon pairs; the fine structure splitting is preferably within an interval of between −100 μeV and +100 μeV or even better between −50 μeV and +50 μEV. The normal energy level of the quantum dots is, for example, between 1.27 eV and 1.33 eV.

If, in contrast, the single-photon source 100 according to FIG. 4 is intended to generate single photons with a defined polarization, the quantum dots 160 are preferably formed with 40 000 to 125 000 atoms of the quantum dot material. With such a size of the quantum dots 160, the fine structure splitting, as a rule, becomes large enough for being able to "filter away" the photons also generated in unwanted manner; preferably, a fine structure splitting of at least +400 μeV, especially preferably of at least +500 µeV or more is set. The normal energy level of the quantum dots is, for example, less than 1.1 eV.

FIG. 11 shows a further exemplary embodiment of a single-photon source 100. A substrate 500 with a lower Bragg mirror packet or DBR (distributed Bragg reflector) mirror packet 505, an LED structure 510 located above and a microcavity 515 located above the OED structure 510 can be seen. In distinction from the single-photon source 100 according to FIG. 4, the cavity 515 according to FIG. 11 contains only very few quantum dots. In the text which follows, it is assumed by way of example that the cavity contains only a single quantum dot 520 which is optically excited by the LED structure 510 which can be electrically driven via contacts 525 and 530. The Bragg mirror packet 505 located below the LED structure 510 increases the coupling-out efficiency of the LED structure 510 operating as pumping LED.

The cavity 515 utilizes the Purcell effect which describes the influence of the resonant coupling of the energetic states of the quantum dot 520 to the modes of the cavity 515 on the spontaneous emission rate. The parameter which quantifies this effect is the Purcell factor $F_P$. This is dependant on the quality and the mode volume of the cavity and describes the ratio of the lives of a quantum-mechanical state outside and inside a cavity, according to:

$$F_P = \tau_{free}/\tau_{cav}.$$

The relationship between Purcell factor and the cavity parameters is given by $$F_P \sim 3Q(\lambda_c/n)^3/4\pi^2 V$$

where $\lambda_c$: wavelength, n: refractive index, V: mode volume.

In this context, the parameters of importance to the design of the cavity 515 are the mode volume V and the quality factor Q of the cavity 515. The challenge in designing the cavity 515 mainly consist in achieving a sufficiently small mode volume V. To achieve a distinct influence on the spontaneous emission rate by the Purcell effect, small cavity diameters d of 0.5 µm up to maximally 3 µm are worthwhile. As can be seen immediately, the Purcell factor can be easily increased by reducing the cavity diameter since $F_P \sim 1/V$ holds true.

The quality factor Q is dependant on the internal and external optical losses of the cavity 515. Internal losses are produced by light absorption, external losses are produced by partially intended coupling-out by the resonator mirrors due to their finite reflectivity and various scattering mechanisms. The external optical losses of the cavity increase with decreasing column diameter d of the cavity 515. The causes of this are a decrease in mirror reflectivities due to increasingly curved wavefronts, a decreasing horizontal wave guidance and the increasing light scattering caused by roughnesses at the column jacket 540 of the cavity. Since the quality of the cavity is directly included in the Purcell factor, it can be easily seen that an increase in the Purcell factor is only limited by reducing the cavity diameter d. However, the demand for small column diameter d entails the problem that the optical losses are greatly increased with decreasing diameter, resulting in a dramatic degradation of the quality factor Q of the cavity.

To counteract the increasing optical losses of the cavity with a reduction in column diameter d, the column jacket 540 of the single-photon source 100 shown in FIG. 11 is provided with a highly reflective coating 550. The highly reflective coating 550 can be formed, for example, by a layer of gold. With this configuration, Purcell factors can be achieved which are distinctly higher than in the case of single-photon sources 100 having uncoated or differently coated cavities.

In addition, the field distribution within the cavity 515 can be optimized even further with regard to minimal losses and minimum mode volumes via $AlO_x$ apertures which are identified by the reference symbol 560 in FIG. 11, by keeping the optical field distribution as far away from the column edge 540 of the cavity as possible. In addition, the $AlO_x$ layers reduce the effective refractive index within the cavity which is smaller than the refractive index of the mirror layers adjoining above and below, consisting, e.g. of GaAs. A minimum cavity length of $\lambda/2$ is only made possible by this means.

The emission spectrum of the LED 510 used for the optical excitation is preferably selected in such a manner that the excitation is energetically above the states of the quantum dot 520; the cavity 515 is preferably transparent in this wavelength range.

The curve 600 of FIG. 12 shows the luminescence spectrum of the quantum dot 520 at low temperatures; the curve 610 shows the electroluminescence of the excitation LED. The reference symbols 265, 265' and 265" designate the longitudinal modes of the cavity 515.

The single-photon source 100 shown in FIG. 11 also meets all requirements made initially for a component which can be used for quantum cryptography. Firstly, the single-photon source 100 is capable of processing electrical signals directly. By utilizing the Purcell effect, the spontaneous emission rate is sufficiently high and can be increased further because of the effective suppression of optical losses by the mirroring of the cavity jacket 540. The cavity 515 also has a positive effect on the radiation characteristic. Thus, a round beam profile is obtained so that any optical losses during the injection into fibers are reduced. Even if there are a number of quantum dots in the cavity 515 which are optically excited into emission of photons, the filtering characteristic of the cavity ensures that only photons within a very narrow frequency band, that is to say photons of a single quantum dot, are coupled out of the cavity. In this case, quantum dots with emission wavelengths of 1.3 µm and 1.55 µm, respectively, can be achieved. Thus, optical fiber networks already installed can be utilized with this single-photon source 100. The single-photon sources 100 can be produced by means of methods already established. As well, mature technologies can be used for the system integration.

If the single-photon source 100 according to FIG. 11 is intended to generate entangled photon pairs, the quantum dot 520 is preferably formed with 800 to 5000 atoms of the quantum dot material. By choosing the size of the quantum dot 520, a fine structure splitting of between −100 µeV and +100 µeV or better between only −50 µeV and +50 µeV is preferably set—the ideal would be precisely 0. The normal energy level of the quantum dot 520 is, for example, between 1.27 eV and 1.33 eV. The height h of the quantum dot is in this case preferably between 0.3 nm and 0.9 nm.

If, in contrast, the single-photon source 100 according to FIG. 11 is intended to generate photons with a defined polarization, the quantum dot 520 is preferably formed with 40 000 to 125 000 atoms of the quantum dot material. With such a size of the quantum dot 520, the fine structure splitting, as a rule, becomes large enough to be able to "filter away" the photons also generated in an unwanted manner; in a preferred manner, a fine structure splitting of at least +400 µeV, particularly preferably of at least +500 µeV or more is set. The normal energy level of the quantum dot 520 is, for example, less than 1.1 eV. The height h of the quantum dot is preferably greater than 2 nm in this case.

List of Reference Symbols
10 Small quantum dot
15 Large quantum dot

100 Single-photon source
105 Substrate
110 Lower Bragg mirror packet
115 Mirror layer pairs
120 Lower electrical contact layer
130 Pin diode structure
140 Upper electrical contact layer
150 Active layer
160 Quantum dots
160' Excited quantum dots
160" Non-excited quantum dots
165 Intermediate layer
170 Upper Bragg mirror packet
180 Photons
190, 195 Electrical connecting contacts
200 Non-conductive layer
210 Opening
220 Current aperture
250 Curve for high reflective index contrast
255 Curve for low reflective index contrast
260 Microcavity
265,265',265" Cavity dips
270, 270' Curves
280, 285 Curves
500 Substrate
505 Lower Bragg mirror packet
510 LED structure
515 Microcavity
520 Single quantum dot
525, 530 Contacts
540 Column edge
550 Highly reflective coating
600, 610 Curves
x Exciton
XX Biexciton
FSS Fine structure splitting
n+, n− Mutually perpendicular directions of polarization
P1, P2 Doping profiles
$\Delta\lambda c$ Spectral width of a cavity dip
$\Delta\lambda f$ Free spectral range between cavity dips
L Length of the cavity

The invention claimed is:

1. A method for producing a single-photon source configured to emit only a single photon with a single pre-defined polarization in response to an electrical trigger signal and having a predetermined operating characteristic, the method which comprises:
choosing a desired fine structure splitting of an exciton energy level of at least one quantum dot, said fine structure splitting being at least 300 µeV;
determining a quantum dot size corresponding to the desired fine structure splitting of at least 300 µeV; and
establishing the predetermined operating characteristic of the single-photon source by producing at least one quantum dot with the determined quantum dot size corresponding to the desired fine structure splitting of at least 300 µeV.

2. The method according to claim 1, which comprises, for producing a single-photon source generating entangled photon pairs, forming the at least one quantum dot with 800 to 5000 atoms of a quantum dot material.

3. The method according to claim 1, which comprises, for producing a single-photon source generating entangled photon pairs, setting a normal energy level of the at least one quantum dot to between 1.27 eV and 1.33 eV.

4. The method according to claim 1, which comprises, for producing a single-photon source generating single photons with a defined polarization, forming the at least quantum dot with 40 000 to 125 000 atoms of a quantum dot material.

5. The method according to claim 1, which comprises, for producing a single-photon source generating single photons with a defined polarization, setting a normal energy level of the at least one quantum dot to less than 1.1 eV.

6. The method according to claim 1, which comprises producing a single-photon source generating entangled photon pairs and thereby setting a height of the at least one quantum dot to a value of between 0.3 nm and 0.9 nm.

7. The method according to claim 1, which comprises producing a single-photon source generating single photons with a defined polarization and thereby setting a height of the at least one quantum dot to a value of greater than 2 nm.

8. The method according to claim 1, further comprising the steps of producing a charge carrier injection device and arranging said charge carrier injection device such that said charge carrier injection device injects charge carriers into said quantum dots upon generation of said electrical trigger signal.

9. A method for producing a single-photon-pair source configured to emit only a single entangled photon pair in response to an electrical trigger signal and having a predetermined operating characteristic, the method which comprises:
choosing a desired fine structure splitting of an exciton energy level of at least one quantum dot, said fine structure splitting being between −50 µeV and +50 µeV;
determining a quantum dot size corresponding to the fine structure splitting of between −50 µeV and +50 µeV; and
establishing the predetermined operating characteristic of the single-photon-pair source by producing at least one quantum dot with the determined quantum dot size corresponding to the desired fine structure splitting of between −50 µeV and +50 µeV.

10. The method according to claim 9, further comprising the steps of producing a charge carrier injection device and arranging said charge carrier injection device such that said charge carrier injection device injects charge carriers into said quantum dots upon generation of said electrical trigger signal.

* * * * *